United States Patent
Ho et al.

(10) Patent No.: US 11,290,116 B2
(45) Date of Patent: Mar. 29, 2022

(54) CONTROL CIRCUIT OF DELAY LOCK LOOP AND CONTROL METHOD THEREOF

(71) Applicant: Winbond Electronics Corp., Taichung (TW)

(72) Inventors: Zong-Ying Ho, Taichung (TW); Chi-Hsiang Sun, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/391,035

(22) Filed: Aug. 2, 2021

(65) Prior Publication Data

US 2022/0069827 A1 Mar. 3, 2022

(30) Foreign Application Priority Data

Aug. 27, 2020 (TW) .................................. 109129393

(51) Int. Cl.
*H03L 7/081* (2006.01)
*H03K 19/20* (2006.01)

(52) U.S. Cl.
CPC ............ *H03L 7/0814* (2013.01); *H03K 19/20* (2013.01)

(58) Field of Classification Search
None
See application file for complete search history.

(56) References Cited

U.S. PATENT DOCUMENTS

| | | |
|---|---|---|
| 6,650,594 B1 | 11/2003 | Lee et al. |
| 7,352,218 B2 | 4/2008 | Choi |
| 2008/0001640 A1 | 1/2008 | Choi |
| 2009/0015302 A1 | 1/2009 | You |
| 2017/0250599 A1* | 8/2017 | Kim .................. H02M 1/08 |

* cited by examiner

*Primary Examiner* — Cassandra F Cox
(74) *Attorney, Agent, or Firm* — JCIRPNET

(57) ABSTRACT

A control circuit of delay lock loop and a control method thereof are provided. The control circuit includes a power status detector, a voltage comparator, an enable signal generator and a control signal generator. The power status detector detects a transition edge of a clock enable signal to generate a trigger signal corresponding to a variation of an operation power. The voltage comparator compares the operation power with a reference voltage to generate a comparison result. The enable signal generator sets an enable signal to an active state according to the trigger signal and sets the enable signal to a non-active state according to the comparison result. The control signal generator outputs a control clock to generate a control signal when the enable signal is in the active state.

16 Claims, 3 Drawing Sheets

CONTROL CIRCUIT OF DELAY LOCK LOOP AND CONTROL METHOD THEREOF

CROSS-REFERENCE TO RELATED APPLICATION

This application claims the priority benefit of Taiwan application serial no. 109129393, filed on Aug. 27, 2020. The entirety of the above-mentioned patent application is hereby incorporated by reference herein and made a part of this specification.

TECHNICAL FIELD

The invention relates to a control circuit of a delay lock loop and a control method thereof, and more particularly, to a control circuit of a delay lock loop applied to a memory and a control method thereof.

BACKGROUND

Referring to FIG. 1, in the conventional technical field, when a clock enable signal CKE in a dynamic random access memory is pulled up from a low logic level to a high logic level, the dynamic random access memory may leave a power down mode, and a voltage value of a received operation voltage VINT will drop. When the voltage value of the operation voltage VINT drops, a variation of a clock cycle of a read data DQS provided by the dynamic random access memory will occur, and makes a clock signal CLK asynchronous with transition of the read data DQS. Consequently, if the read data DQS is captured at a time point TS, data reading errors may occur to reduce the reliability.

SUMMARY

The invention provides a control circuit of a delay lock loop and a control method thereof, which can improve the reliability of data reading in the application of memory.

The control circuit of the delay lock loop of the invention includes a power status detector, a voltage comparator, an enable signal generator and a control signal generator. The power status detector receives a clock enable signal, and detects a transition edge of the clock enable signal to generate a trigger signal corresponding to a variation of an operation power. The voltage comparator compares the operation power with a reference voltage to generate a comparison result. The enable signal generator is coupled to the power status detector and the voltage comparator, receives the trigger signal, sets an enable signal to an active state according to the trigger signal, and sets the enable signal to a non-active state according to the comparison result. The control signal generator receives the enable signal and a control clock, and outputs the control clock to generate a control signal when the enable signal is in the active state.

The control method of the delay lock loop of invention includes: detecting a transition edge of a clock enable signal to generate a trigger signal corresponding to a variation of an operation power; comparing the operation power with a reference voltage to generate a comparison result; setting an enable signal to an active state according to the trigger signal, and setting the enable signal to a non-active state according to the comparison result; and outputting a control clock to generate a control signal when the enable signal is in the active state. The control signal is configured to control a locking operation of the delay lock loop to be started or stopped.

Based on the above, with respect to the variation of the operation power, the invention stops the locking operation of the delay lock loop through the generated control signal during a time interval when the operating power supply is unstable, so as to maintain the reliability of data read from the memory.

DETAILED DESCRIPTION

Figure 1:
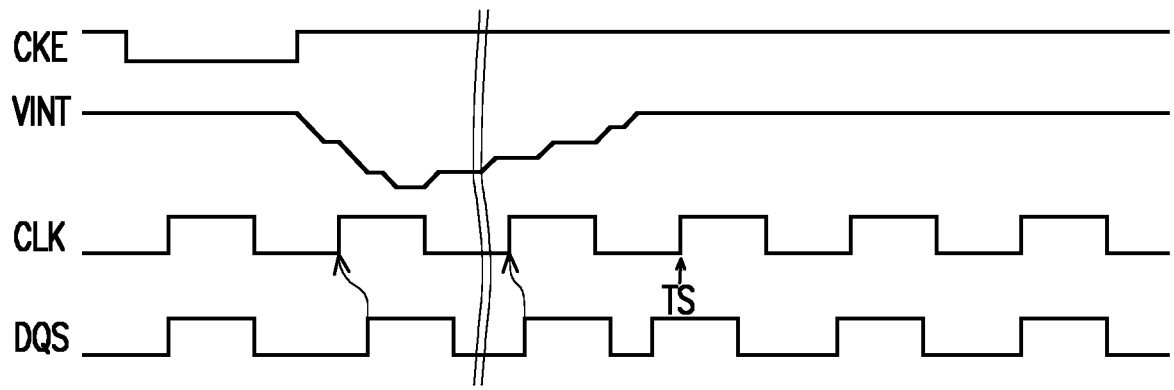
FIG. 1 is an operation waveform diagram of a conventional memory.
Figure 2:
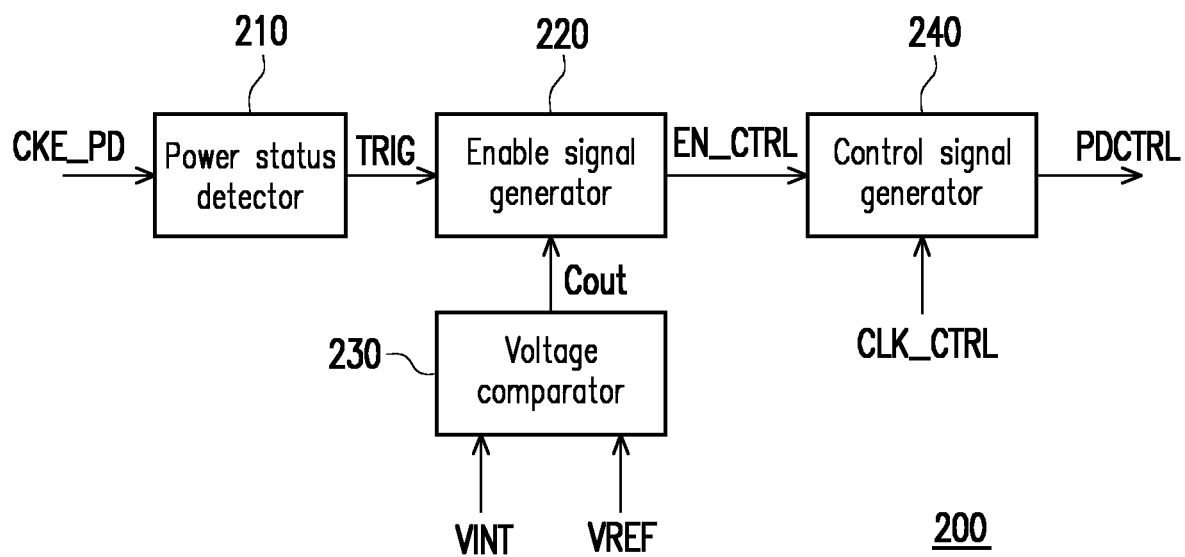
FIG. 2 illustrates a schematic diagram of a control circuit of a delay lock loop (DLL) according to an embodiment of the invention.

Referring to FIG. 2, a control circuit 200 includes a power status detector 210, an enable signal generator 220, a voltage comparator 230 and a control signal generator 240. The power status detector 210 receives a clock enable signal CKE_PD. The power status detector 210 detects a transition edge of the clock enable signal CKE_PD to generate a trigger signal TRIG corresponding to a variation of an operation power VINT. Here, in the application of memory, after the clock enable signal CKE_PD is pulled up from a low logic level to a high logic level, a voltage value of the operation power VINT will drop. Accordingly, in this embodiment, the power status detector 210 may detect a rising edge of the clock enable signal CKE_PD to generate the trigger signal TRIG. The trigger signal TRIG is a pulse signal. In this embodiment, when the trigger signal TRIG generates a negative pulse, the variation of the operation power VINT is "dropping".

The enable signal generator 220 is coupled to the power status detector 210 and configured to receive the trigger signal TRIG. The enable signal generator 220 is configured to generate an enable signal EN_CTRL. The enable signal generator 220 sets the enable signal EN_CTRL to an active state according to the trigger signal TRIG. Further, the enable signal generator 220 further receives a comparison result Cout and sets the enable signal EN_CTRL to a non-active state according to the comparison result Cout. The active state and the non-active state may be presented by different logic levels. Herein, the enable signal EN_CTRL at a first logic level is in the active state, and the enable signal EN_CTRL at a second logic level is in the non-active state. The first logic level may be one of the high logic level and the low logic level, and the second logic level may be the other of the high logic level and the low logic level.

In addition, the voltage comparator 230 is coupled to the enable signal generator 220. The voltage comparator 230 receives the operation power VINT and a reference voltage VREF, and generates the comparison result Cout according to the operation power VINT and the reference voltage VREF. When the voltage value of the operation power VINT is lower than that of the reference voltage VREF, the voltage comparator 230 may provide the comparison result Cout so that the enable signal generator 220 sets the generated enable signal EN_CTRL to the non-active state. Moreover, when the voltage value of the operation power VINT is restored to be greater than that of the reference voltage VREF, the voltage comparator 230 provides the comparison result Cout so that the enable signal generator 220 changes the generated enable signal EN_CTRL to the active state.

The control signal generator 240 is coupled to the enable signal generator 220. The control signal generator 240 receives the enable signal EN_CTRL and a control clock CLK_CTRL, and determines whether to output the control clock CLK_CTRL to generate a control signal PDCTRL according to the enable signal EN_CTRL. The control signal generator 240 provides the control clock CLK_CTRL to generate the control signal PDCTRL when the enable signal EN_CTRL is in the active state. Conversely, when the enable signal EN_CTRL is in the non-active state, the control signal generator 240 sets the control signal PDCTRL to a fixed logic level (e.g., the low logic level).

It can be known from the above description that, in the embodiment of the invention, the power status detector 210 detects a time point at which the variation of the operation power VINT occurs. When the variation of the operation power VINT occurs, the voltage comparator 230 compares the operation power VINT with the reference voltage VREF to learn a recovery state of the operation power VINT after dropping. In a time interval from the time point at which the variation of the operation power VINT occurs until the operation power VINT stabilizes to a normal state (greater than the reference voltage VREF), the control signal generator 240 may maintain the control signal PDCTRL at the fixed low logic level and stop a locking operation of the delay lock loop through the enable signal EN_CTRL in the non-active state. Further, in this embodiment, after the operation power VINT stabilizes to the normal state, through the enable signal EN_CTRL in the activate state, the control signal generator 240 may generate the control signal PDCTRL equal to the control clock CLK_CTRL and restart the locking operation of the delay lock loop. In this way, the delay lock loop can quickly complete the locking operation and maintain the correctness of the data read by the memory.

Figure 3:
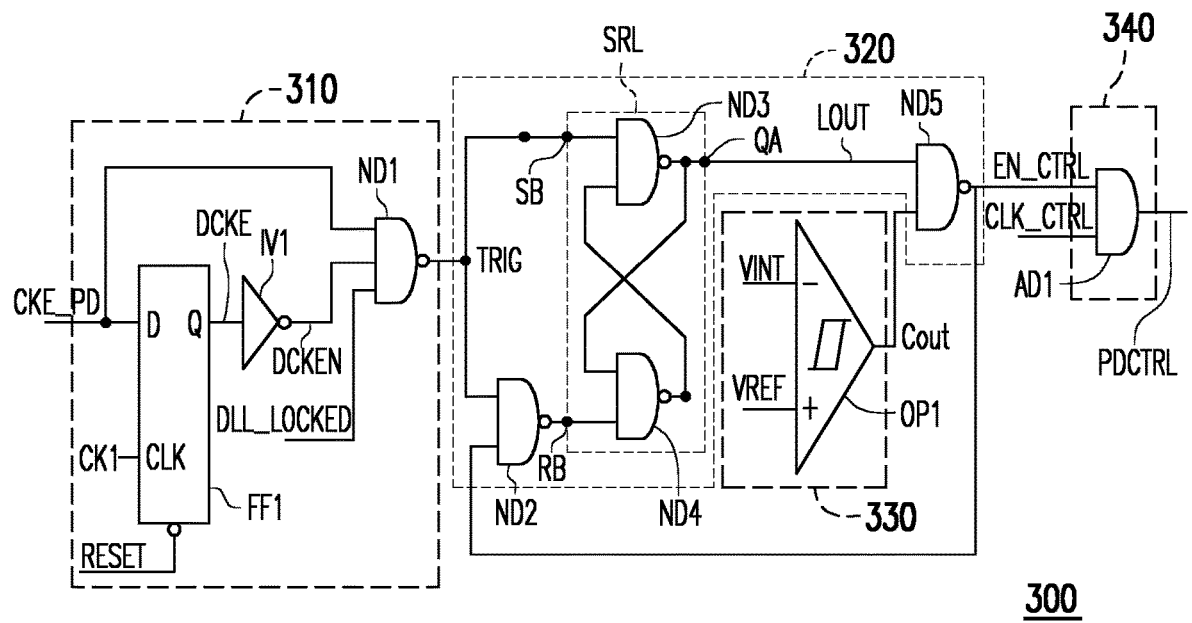
FIG. 3 illustrates a circuit diagram of a control circuit of a delay lock loop according to an embodiment of the invention.

Referring to FIG. 3, a control circuit 300 includes a power status detector 310, an enable signal generator 320, a voltage comparator 330 and a control signal generator 340. The power status detector 310 includes a flip-flop FF1 and a logic circuit composed of an inverter IV1 and an NAND gate ND1. A data terminal D of the flip-flop FF1 receives the clock enable signal CKE_PD; a clock terminal CLK of the flip-flop FF1 may receive a clock signal CK1; an output terminal Q of the flip-flop FF1 is coupled to an input terminal of the inverter IV1 and provides a clock enable delay signal DCKE; the flip-flop FF1 receives a reset signal RESET to perform a reset operation. The inverter IV1 is configured to generate an inverted clock enable delay signal DCKEN using the clock enable delay signal DCKE. The NAND gate ND1 receives the clock enable signal CKE_PD, the inverted clock enable delay signal DCKEN and a locking signal DLL_LOCKED, and in the case where the delay lock loop is locked, generates the negative pulse of the trigger signal TRIG according to a phase difference between the rising edge of the clock enable signal CKE_PD and a falling edge of the inverted clock enable delay signal DCKEN. A length of the negative pulse of the trigger signal TRIG is equal to a length of time between the rising edge of the clock enable signal CKE_PD and the falling edge of the inverted clock enable delay signal DCKEN.

The enable signal generator 320 includes a set/reset latch (SR latch) SRL, and NAND gates ND2 and ND5. The set/reset latch SRL includes NAND gates ND3 and ND4. A set terminal SB of the set/reset latch SRL receives the trigger signal TRIG, and a reset terminal RB of the set/reset latch SRL is coupled to an output terminal of the NAND gate ND2. The set/reset latch SRL is configured to sense the negative pulse of the trigger signal TRIG and correspondingly generates a latch signal LOUT at the high logic level at an output terminal OA.

The NAND gate ND5 forms an output control circuit. The NAND gate ND5 receives the latch signal LOUT and the comparison result Cout generated by the voltage comparator 330, and generates the enable signal EN_CTRL according to the latch signal LOUT and the comparison result Cout. In this embodiment, the enable signal EN_CTRL in the active state is at the high logic level, and the enable signal EN_CTRL in the non-active state is at the low logic level.

The voltage comparator 330 receives the operation power VINT and the reference voltage VREF for comparison, and thereby generates the comparison result Cout. The voltage comparator 330 may be constructed by an operational amplifier OP1 of hysteresis type. A positive input terminal of the operational amplifier OP1 receives the reference voltage VREF, and a negative input terminal of the operational amplifier OP1 receives the operation power VINT.

After the negative pulse of the trigger signal TRIG appears and the voltage value of the operation power VINT remains lower than the reference voltage VREF, the voltage comparator 330 generates the comparison result Cout at the high logic level. In conjunction with the latch signal LOUT, which is also at a high logic level, the NAND gate ND5 may generate the enable signal EN_CTRL in the non-active state. When the voltage value of the operation power VINT rises to be greater than the reference voltage VREF, the comparison result Cout generated by the voltage comparator 330 is changed to the low logic level, so that the inverter ND5 generates the enable signal EN_CTRL in the active state.

At the same time, based on the enable signal EN_CTRL at the high logic level, the NAND gate ND2 may provide a low logic level signal to the reset terminal RB of the set/reset latch SRL according to the trigger signal TRIG and the enable signal EN_CTRL which are also at the high logic level, and reset the latch signal LOUT to the low logic level. In the case where the latch signal LOUT is at the low logic level, the enable signal EN_CTRL is changed to the active state (the high logic level).

The control signal generator 340 may be constructed by an AND gate AD1. The AND gate AD1 receives the enable signal EN_CTRL and the control clock CLK_CTRL, and determines whether to output the control clock CLK_CTRL to generate the control signal PDCTRL according to whether the enable signal EN_CTRL is in the activate state. When the enable signal EN_CTRL is at the high logic level, the control signal PDCTRL is the same as the control clock CLK_CTRL. In contrast, when the enable signal EN_CTRL is at the low logic level, the control signal PDCTRL is at the low logic level.

Figure 4:
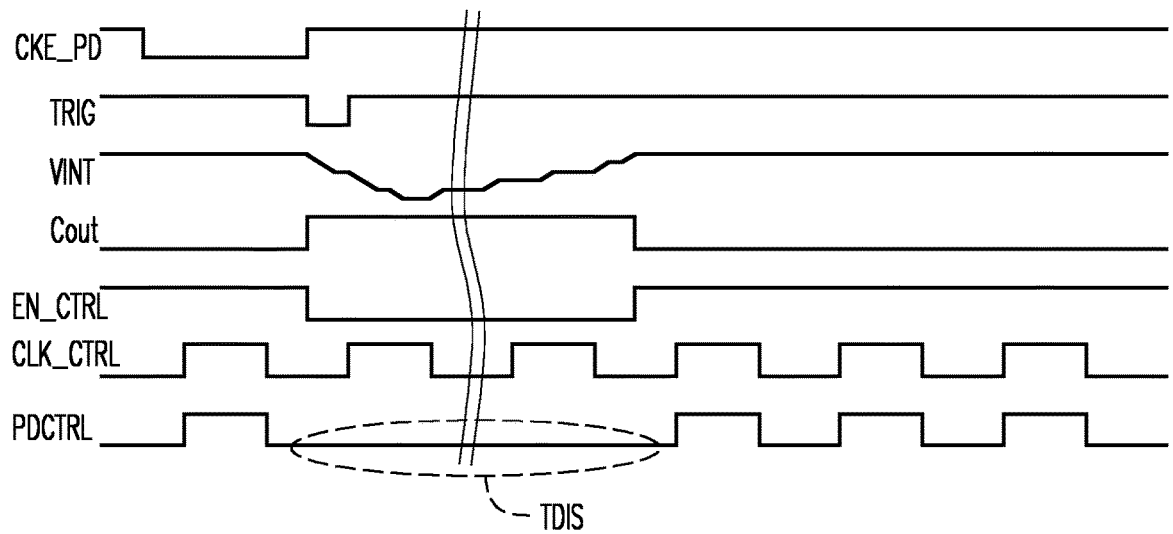
FIG. 4 illustrates an operation waveform diagram of the control circuit in the embodiment of FIG. 3 of the invention.

Here, referring to FIG. 4, the negative pulse of the trigger signal TRIG may be generated according to the rising edge of the clock enable signal CKE_PD. In a time interval TDIS during which the enable signal EN_CTRL is in the non-activate state, the locking operation of the delay lock loop may be stopped through the control signal PDCTRL maintained at the low logic level. Moreover, after the voltage value of the operation power VINT is restored (after the time interval TDIS), the control signal PDCTRL is restored to be equal to the control clock CLK_CTRL, and the locking operation of the delay lock loop is restarted.

Figure 5:
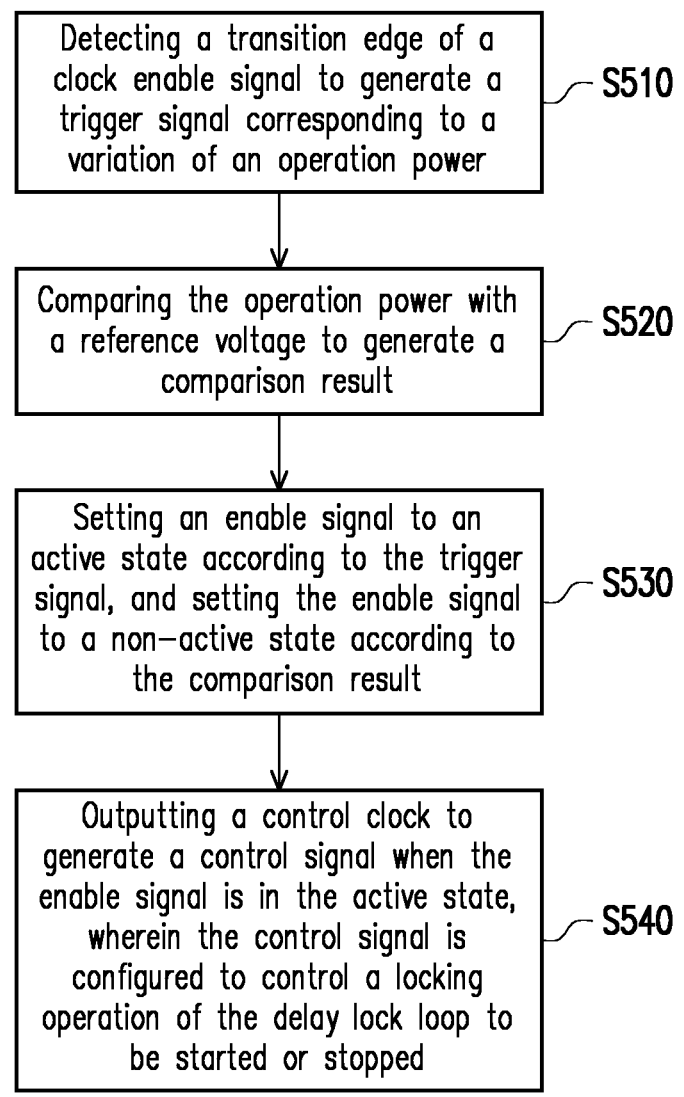
FIG. 5 illustrates a flowchart of a control method of a delay lock loop according to an embodiment of the invention.

Referring to FIG. 5, in step S510, a transition edge of a clock enable signal is detected to generate a trigger signal corresponding to a variation of an operation power; in step S520, the operation power is compared with a reference voltage to generate a comparison result; in step S530, an enable signal is set to an active state according to the trigger signal, and the enable signal is set to a non-active state according to the comparison result; and in step S540, a control clock is output to generate a control signal when the enable signal is in the active state, wherein the control signal is configured to control a locking operation of the delay lock loop to be started or stopped.

Relevant implementation details for the steps above have been described in the foregoing embodiments, and will not be repeated hereinafter.

In summary, according to the invention, the transition edge of the clock enable signal is detected to stop the locking operation of the clock signal of the delay lock loop when the voltage value of the operation power drops. In the application of memory, clock information corresponding to the read data may be kept synchronized with the clock signal to maintain the reliability of the read data.

The invention claimed is:

1. A control circuit of a delay lock loop, comprising:
    a power status detector, receiving a clock enable signal, and detecting a transition edge of the clock enable signal to generate a trigger signal corresponding to a variation of an operation power;
    a voltage comparator, comparing the operation power with a reference voltage to generate a comparison result;
    an enable signal generator coupled to the power status detector and the voltage comparator, receiving the trigger signal, setting an enable signal to an active state according to the trigger signal, and setting the enable signal to a non-active state according to the comparison result; and
    a control signal generator, receiving the enable signal and a control clock, and outputting the control clock to generate a control signal when the enable signal is in the active state.

2. The control circuit of claim 1, wherein the transition edge is a rising edge, and the power status detector detects the rising edge of the clock enable signal to generate the trigger signal as a pulse signal.

3. The control circuit of claim 1, wherein the power status detector comprises:
    a flip-flop, having a data terminal receiving the clock enable signal, a clock terminal of the flip-flop receiving a clock signal, an output terminal of the flip-flop generating a clock enable delay signal; and
    a logic circuit, performing a logic operation on the clock enable signal and the clock enable delay signal, and generating the trigger signal according to a time delay between the clock enable signal and the clock enable delay signal.

4. The control circuit of claim 3, wherein the logic circuit comprises:
    an inverter, receiving the clock enable delay signal to generate an inverted clock enable delay signal; and
    an AND gate, performing the logic operation on the inverted clock enable delay signal and the clock enable signal to generate the trigger signal.

5. The control circuit of claim 4, wherein the AND gate further receives a locking signal, and determines whether to generate the trigger signal according to the locking signal.

6. The control circuit of claim 1, wherein the voltage comparator comprises:
    an operational amplifier, having a negative input terminal receiving the operation power, a positive input terminal of the operational amplifier receiving the reference voltage, an output terminal of the operational amplifier generating the comparison result.

7. The control circuit of claim 1, wherein the voltage comparator is a hysteresis comparator.

8. The control circuit of claim 1, wherein the enable signal generator comprises:
    a set/reset latch, having a set terminal receiving the trigger signal, a reset terminal of the set/reset latch receiving an inverted signal of the enable signal, an output terminal of the set/reset latch generating a latch signal.

9. The control circuit of claim 8, wherein the enable signal generator further comprises:
    an output control circuit coupled to the output terminal of the set/reset latch, receiving the comparison result and the latch signal, and generating the enable signal according to the comparison result and the latch signal.

10. The control circuit of claim 1, wherein the enable signal generator further comprises:
    an NAND gate, having two input terminals respectively receiving the enable signal and the trigger signal, an output terminal of the NAND gate being coupled to a reset terminal of a set/reset latch.

11. The control circuit of claim 1, wherein the control signal generator comprises an AND gate, the AND gate outputting the control clock to generate the control signal when the enable signal is in the active state.

12. The control circuit of claim 1, wherein the control signal is configured to control a locking operation of the delay lock loop to be started or stopped.

13. A control method of a delay lock loop, comprising:
    detecting a transition edge of a clock enable signal to generate a trigger signal corresponding to a variation of an operation power;
    comparing the operation power with a reference voltage to generate a comparison result;
    setting an enable signal to an active state according to the trigger signal, and setting the enable signal to a non-active state according to the comparison result; and
    outputting a control clock to generate a control signal when the enable signal is in the active state, wherein the control signal is configured to control a locking operation of the delay lock loop to be started or stopped.

14. The control method of claim 13, wherein the transition edge is a rising edge.

15. The control method of claim 13, further comprising:
    receiving the clock enable signal to generate a clock enable delay signal; and
    performing a logic operation on the clock enable signal and the clock enable delay signal, and generating the trigger signal according to a time delay between the clock enable signal and the clock enable delay signal.

16. The control method of claim 15, further comprising:
    receiving the clock enable delay signal to generate an inverted clock enable delay signal; and
    performing the logic operation on the inverted clock enable delay signal and the clock enable signal to generate the trigger signal.

* * * * *